(12) United States Patent
Frank et al.

(10) Patent No.: US 10,686,040 B2
(45) Date of Patent: Jun. 16, 2020

(54) ARTIFICIAL SYNAPSE WITH HAFNIUM OXIDE-BASED FERROELECTRIC LAYER IN CMOS FRONT-END

(71) Applicant: International Business Machines Corporation, Armonk, NY (US)

(72) Inventors: Martin M. Frank, Dobbs Ferry, NY (US); Takashi Ando, Tuckahoe, NY (US); Xiao Sun, Pleasantville, NY (US); Jin Ping Han, Yorktown Heights, NY (US); Vijay Narayanan, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/395,084

(22) Filed: Apr. 25, 2019

(65) Prior Publication Data

US 2019/0252500 A1    Aug. 15, 2019

Related U.S. Application Data

(62) Division of application No. 15/797,774, filed on Oct. 30, 2017, now Pat. No. 10,319,818.

(51) Int. Cl.
*H01L 27/088*    (2006.01)
*H01L 29/12*    (2006.01)
(Continued)

(52) U.S. Cl.
CPC ........ *H01L 29/12* (2013.01); *H01L 21/82345* (2013.01); *H01L 23/52* (2013.01);
(Continued)

(58) Field of Classification Search
CPC ..... H01L 2924/1441; H01L 2924/6684; H01L 2924/78391; H01L 27/088; H01L 27/11585
See application file for complete search history.

(56) References Cited

U.S. PATENT DOCUMENTS

| 8,535,952 B2 | 9/2013 | Ranjan et al. |
| 8,698,313 B2 | 4/2014 | Hirano et al. |
| (Continued) | | |

OTHER PUBLICATIONS

H. Ishiwara, "Proposal of Adaptive-Learning Neuron Circuits with Ferroelectric Analog-Memory Weights," Jpn. J. Appl. Phys. 32, 442-446 (Jan. 1993).
(Continued)

*Primary Examiner* — Hoai V Pham
(74) *Attorney, Agent, or Firm* — Vazken Alexanian; Michael J. Chang, LLC (57) ABSTRACT

Artificial synaptic devices with a $HfO_2$-based ferroelectric layer that can be implemented in the CMOS front-end are provided. In one aspect, a method of forming a FET device is provided. The method includes: forming a shallow STI region in a substrate separating a first active area of the substrate from a second active area of the substrate; forming at least one FeFET on the substrate in the first active area having a ferroelectric material including a $HfO_2$-based material; and forming at least one logic FET alongside the at least one FeFET on the substrate in the second active area, wherein the at least one logic FET has a gate dielectric including the $HfO_2$-based material. A FET device formed by the present techniques is also provided.

18 Claims, 8 Drawing Sheets

(51) Int. Cl.
  *H01L 29/06* (2006.01)
  *H01L 27/085* (2006.01)
  *H01L 23/52* (2006.01)
  *H01L 21/8234* (2006.01)
(52) U.S. Cl.
  CPC .......... *H01L 27/085* (2013.01); *H01L 27/088* (2013.01); *H01L 29/0649* (2013.01)

(56) References Cited

U.S. PATENT DOCUMENTS

| | | | |
|---|---|---|---|
| 9,030,881 | B2 | 5/2015 | Tokuhira et al. |
| 9,362,487 | B2 | 6/2016 | Inumiya et al. |
| 9,576,801 | B2 | 2/2017 | Li et al. |
| 10,319,818 | B2 | 6/2019 | Frank et al. |
| 2009/0152636 | A1 | 6/2009 | Chudzik et al. |
| 2009/0261395 | A1* | 10/2009 | Boescke .............. G11C 11/22 257/295 |
| 2018/0053832 | A1 | 2/2018 | Beyer et al. |

OTHER PUBLICATIONS

Kaneko et al., "Ferroelectric Artificial Synapses for Recognition of a Multishaded Image," IEEE Transactions on Electron Devices, vol. 61, Issue 8, pp. 2827-2833 (Aug. 2014).

Chernikova et al., "Ultrathin Hf0.5Zr0.5O2 Ferroelectric Films on Si," ACS Appl. Mater. Interfaces 2016, 8, pp. 7232-7237 (Mar. 2016).

J. Müller, "Ferroelektrizitat in Hafniumdioxid and deren Anwendung in nicht-flüchtigen Halbleiterspeichern," (English translation: "Ferroelectricity in hafnium dioxide and its application in non-volatile semiconductor memories"), Ph.D. Thesis Dissertation, Technical University of Dresden (2014) (5 total pages).

T. Nishimura et al., "Ferroelectricity of nondoped thin HfO2 films in TiN/HfO2/TiN stacks," Japanese Journal of Applied Physics 55, 08PB01 (Jun. 2016) (4 total pages).

T.S. Boscke et al., "Ferroelectricity in hafnium oxide: CMOS compatible ferroelectric field effect transistors," IEEE Internationa Electron Devices Meeting (IEDM), Dec. 2011, 24.5 (4 total pages).

M.H. Park et al., "Ferroelectricity and Antiferroelectricity of Doped Thin HfO2-Based Films," Advanced Materials, vol. 27, No. 11, Feb. 2015, pp. 1811-1831.

A. Chanthbouala et al., "A ferroelectric memristor," Nature Materials, vol. 11, No. 10, Sep. 2012, pp. 860-864.

Z. Wen et al., "Ferroelectric-field-effect-enhanced electroresistance in metal/ferroelectric/semiconductor tunnel junctions," Nature Materials, vol. 12, No. 7, May 2013, pp. 617-621.

S. Fujii et al., "First demonstration and performance improvement of ferroelectric HfO2-based resistive switch with low operation current and intrinsic diode property," 2016 IEEE Symposium on VLSI Technology, Jun. 2016, 2 pages.

S. Oh et al., "HfZrOx-Based Ferroelectric Synapse Device With 32 Levels of Conductance States for Neuromorphic Applications," IEEE Electron Device Letters, vol. 38, No. 6, Jun. 2017, pp. 732-735.

List of IBM Patents or Applications Treated as Related (2 pages).

* cited by examiner

ARTIFICIAL SYNAPSE WITH HAFNIUM OXIDE-BASED FERROELECTRIC LAYER IN CMOS FRONT-END

CROSS-REFERENCE TO RELATED APPLICATION(S)

This application is a divisional of U.S. application Ser. No. 15/797,774 filed on Oct. 30, 2017, now U.S. Pat. No. 10,319,818, the disclosure of which is incorporated by reference herein.

FIELD OF THE INVENTION

The present invention relates to artificial synaptic devices, and more particularly, to artificial synaptic devices with a hafnium oxide ($HfO_2$)-based ferroelectric layer that can be implemented in the complementary metal-oxide-semiconductor (CMOS) front-end.

BACKGROUND OF THE INVENTION

The realization of a synaptic element is of interest for hardware implementation of deep learning networks. Weights are modified and stored by modulating the conductivity of non-volatile memory array elements. Use of the adjustable channel conductance of ferroelectric (FE) field-effect transistors (FETs) FE-FETs as a synaptic weight date back to the early 1990s. See, for example, H. Ishiwara, "Proposal of Adaptive-Learning Neuron Circuits with Ferroelectric Analog-Memory Weights," Jpn. J. Appl. Phys. 32, 442-446 (January 1993).

Significant progress has been made using perovskite ferroelectrics such as $Pb(Zr,Ti)O_3$ in the silicon complementary metal-oxide-semiconductor (CMOS) back-end. See, for example, Kaneko et al., "Ferroelectric Artificial Synapses for Recognition of a Multishaded Image," IEEE Transactions on Electron Devices, vol. 61, Issue 8 (August 2014). However, implementation remains challenging due to incompatibilities of perovskite ferroelectrics with CMOS processing, e.g., due to the need for thick films and hydrogen barriers, thermal budgets that are incompatible with the CMOS front-end (for example a gate-first thermal budget can exceed temperatures at which many perovskite ferroelectrics are thermally stable), and contamination risks posed by lead-containing perovskites.

Thus, improved techniques for implementing ferroelectric artificial synaptic devices in the CMOS front-end would be desirable.

SUMMARY OF THE INVENTION

The present invention provides artificial synaptic devices with a hafnium oxide ($HfO_2$)-based ferroelectric layer that can be implemented in the complementary metal-oxide-semiconductor (CMOS) front-end. In one aspect of the invention, a method of forming a field-effect transistor (FET) device is provided. The method includes: forming a shallow trench isolation (STI) region in a substrate separating a first active area of the substrate from a second active area of the substrate; forming at least one ferroelectric FET (FeFET) on the substrate in the first active area having a ferroelectric material including a hafnium oxide ($HfO_2$)-based material; and forming at least one logic FET alongside the at least one FeFET on the substrate in the second active area, wherein the at least one logic FET has a gate dielectric including the $HfO_2$-based material.

In another aspect of the invention, another method of forming a FET device is provided. The method includes: forming a STI region in a substrate separating a first active area of the substrate from a second active area of the substrate; forming at least one FeFET on the substrate in the first active area having a ferroelectric material including a first $HfO_2$-based material; and forming at least one logic FET alongside the at least one FeFET on the substrate in the second active area, wherein the at least one logic FET has a gate dielectric including a second $HfO_2$-based material.

In yet another aspect of the invention, a FET device is provided. The FET device includes: a substrate having a first active area separated from a second active area by a STI region; at least one FeFET on the substrate in the first active area having a ferroelectric material including a $HfO_2$-based material; and at least one logic FET alongside the at least one FeFET on the substrate in the second active area, wherein the at least one logic FET has a gate dielectric including the $HfO_2$-based material.

A more complete understanding of the present invention, as well as further features and advantages of the present invention, will be obtained by reference to the following detailed description and drawings.

DETAILED DESCRIPTION OF PREFERRED EMBODIMENTS

Provided herein are ferroelectric artificial synapse devices that can be implemented in the complementary metal-oxide-semiconductor (CMOS) front-end along with, e.g., non-synaptic devices such as logic field effect transistors (FETs). As will be described in detail below, according to an exemplary embodiment the present artificial synapse devices are configured as ferroelectric FETs (FeFETs) that are co-fabricated with logic FETs in the CMOS front-end-of-line (FEOL). Advantageously, both the FeFET and logic FETs can leverage hafnium oxide ($HfO_2$)-based dielectrics which can be tuned to provide thermal stability in the ferroelectric phase compatible with the high thermal budget in CMOS FEOL (TFEOL).

For instance, activation and/or other anneals performed in logic FET process flows can exceed 1000° C. If being co-fabricated with a logic FET, the ferroelectric material used in the FeFET must be thermally stable at these elevated temperatures. By "thermally stable" it means that the ferroelectric material of the FeFET remains crystallized in the ferroelectric phase. Namely, a ferroelectric material is a material that exhibits electrically switchable spontaneous polarization. See, for example, Chernikova et al., "Ultrathin $Hf_{0.5}Zr_{0.5}O_2$ Ferroelectric Films on Si," ACS Appl. Mater. Interfaces 2016, 8, pgs. 7232-7237 (March 2016) (hereinafter "Chernikova"), the contents of which are incorporated by reference as if fully set forth herein. After deposition, an anneal may be needed to crystallize the ferroelectric material in the ferroelectric phase. The ferroelectric phase is necessary for proper operation of the FeFET.

According to an exemplary embodiment, $HfO_2$-based materials are employed as the ferroelectric material in the FeFETs and as the dielectric in the logic FETs (wherein the FeFETs and the logic FETs are co-fabricated in a common process flow). Suitable $HfO_2$-based materials include, but are not limited to, pure $HfO_2$, hafnium zirconate ($Hf_{0.5}Zr_{0.5}O_2$), and/or $HfO_2$ doped with small quantities of nitrogen (N), carbon (C), silicon (Si), aluminum (Al), lanthanum (La), gadolinium (Gd), yttrium (Y), scandium (Sc), and/or strontium (Sr). By way of example only, for X-doped $HfO_2$ where X is a metal (i.e., Al, La, Gd, Sc and/or Sr) or Si, an ion percentage $[X]/([Hf]+[X])$ of less than about 10%, e.g., from about 2% to about 6% and ranges therebetween is considered a small dopant quantity. Similarly, when X is N or C, an ion percentage $[X]/([O]+[X])$ of less than about 10%, e.g., from about 2% to about 6% and ranges therebetween is considered a small dopant quantity.

Figure 3:
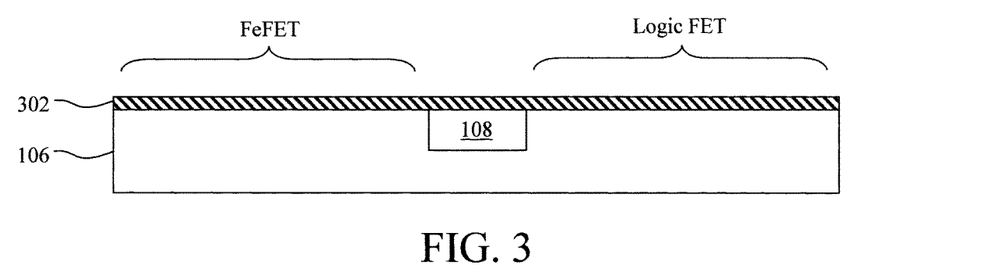
FIG. 3 is a diagram illustrating a hafnium oxide ($HfO_2$)-based material having been deposited onto the substrate in both the FeFET (Active area I) and the logic FET (Active area II) regions according to an embodiment of the present invention.
Figure 4:
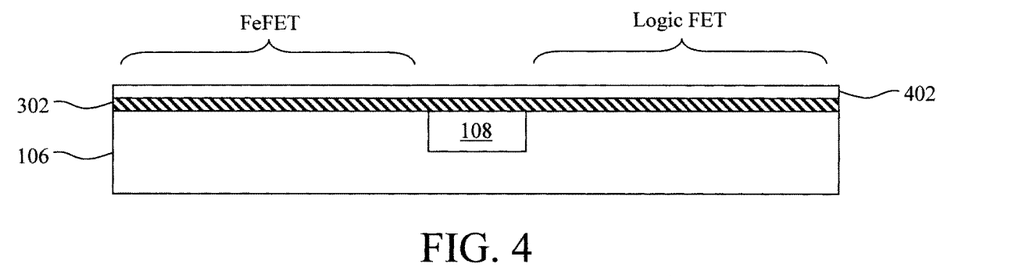
FIG. 4 is a diagram illustrating an optional dielectric capping layer having been deposited onto the $HfO_2$-based material in both the FeFET (Active area I) and the logic FET (Active area II) regions according to an embodiment of the present invention.

Advantageously, dopants such as Si, Al and La raise the $HfO_2$ crystallization temperature (i.e., as compared to pure $HfO_2$), thereby increasing the thermal stability at the TFEOL. See, for example, J. Müller, "Ferroelektrizität in Hafniumdioxid und deren Anwendung in nicht-flichtigen Halbleiterspeichern," (English translation: "Ferroelectricity in hafnium dioxide and its application in non-volatile semiconductor memories"), Ph.D. Thesis Dissertation, Technical University of Dresden (2014) (hereinafter "Müller") (See FIG. 3.16), and S. V. Ushakov et al., "Effect of La and Y on crystallization temperature of hafnia and zirconia," J. Mater. Res., vol. 19, no. 3, pgs. 693-696 (March 2004), the contents of both of which are incorporated by reference as if fully set forth herein. The English translation of terms appearing in FIG. 3.16 of Müller are as follows: Schicktdicke=layer thickness; aus Literature=from literature; Eingrenzung fur=range for; elektr. Daten=electrical data; Kristallisationstemperature=crystallization temperature; Transistor Prozessierung=transistor processing; TiN-Elektrode=TiN electrode; ALD-Prozess=ALD process; Dotierung=doping; and the figure caption: FIG. 3.16: Summary of all crystallization temperatures determined in this work for $HfO_2$, $ZrO_2$, $HfO_2$—$ZrO_2$ and Si/Y/Al:$HfO_2$ as a function of the layer thickness and their comparison to references 1 [235], 2 [236] and 3 [237] available in the literature." Pure $HfO_2$ for instance may crystallize into a paraelectric or ferroelectric phase at a temperature of from about 400° C. to about 600° C., and ranges therebetween. See, for example, T. Nishimura et al., "Ferroelectricity of nondoped thin $HfO_2$ films in TiN/$HfO_2$/TiN stacks," Japanese Journal of Applied Physics 55, 08PB01 (June 2016) (4 total pages), the contents of which are incorporated by reference as if fully set forth herein. By way of example only, the TFEOL is from about 800° C. to about 1200° C., and ranges therebetween, e.g., from about 1000° C. to about 1200° C., and ranges therebetween.

Figure 1:
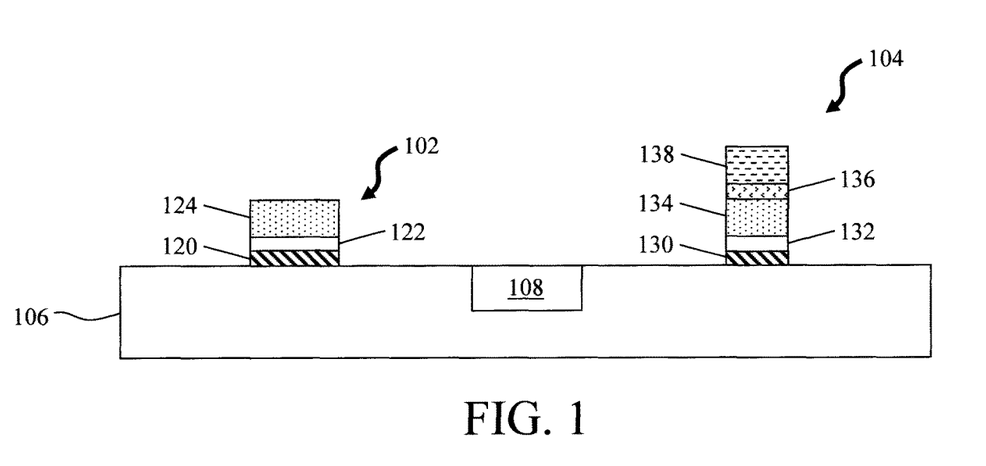
FIG. 1 is a diagram illustrating a field-effect transistor (FET) device including a ferroelectric FET (FeFET) and a logic FET having been co-fabricated alongside one another on a common substrate according to an embodiment of the present invention.

By way of example only, FIG. 1 illustrates an exemplary embodiment whereby an FeFET 102 and a logic FET 104 have been co-fabricated alongside one another on a common substrate 106 in accordance with the present techniques. It is noted that while the figures depict a single FeFET 102 on the substrate 106 alongside a single logic FET 104, this is being done merely for ease and clarity of depiction and it is to be understood that multiple FET devices of either type (i.e., FeFET or logic FET) can be fabricated in the same manner described. Co-fabricating FeFET and logic FET devices on the same substrate can be used to produce circuits having both logic blocks and FeFET blocks for data processing.

Substrate 106 is (n-type or p-type) doped and, as shown in FIG. 1, has at least two active regions (see also FIG. 2—described below), one active region containing at least one FeFET 102 and the other active region containing at least one logic FET 104, separated by a shallow trench isolation (STI) region 108. STI region 108 is formed by first patterning a trench in the substrate (i.e., substrate 106) and then filling the trench with an insulator (also referred to herein generally as an STI insulator) to form the STI region 108. Suitable STI insulators include, but are not limited to, oxides such as silicon dioxide ($SiO_2$).

FeFET 102 includes a ferroelectric material 120 disposed on the substrate 106, an optional dielectric capping layer 122 disposed on the ferroelectric material 120, and an electrode 124 disposed on the dielectric capping layer 122 (or directly on the ferroelectric material 120 if the dielectric capping layer 122 is not used). As provided above, suitable ferroelectric materials 120 include, but are not limited to, $HfO_2$-based materials such as pure $HfO_2$, $Hf_{-0.5}Zr_{-0.5}O_2$, and/or $HfO_2$ doped with small quantities of N, C, Si, Al, La, Gd, Y, Sc, and/or Sr.

Suitable materials for the (optional) dielectric capping layer 122 include, but are not limited to, lanthanum oxide ($La_2O_3$) and/or aluminum oxide ($Al_2O_3$). Dielectric capping layer 122 can be employed, for example, to release metal ions (e.g., La, Al, etc.) to the underlying ferroelectric material 120 during high temperature processing, which when the metal ions reach the substrate 106 can be employed to generate electrical dipoles that tune the range of accessible FeFET threshold voltages (Vt). Suitable materials for use in electrode 124 include, but are not limited to, metals such as titanium nitride (TiN) and/or tantalum nitride (TaN).

As will be described in detail below, according to an exemplary embodiment where steps for fabricating the FeFET and the logic FET are performed concurrently, one or more of the ferroelectric material 120, the dielectric capping layer 122, and the electrode 124 can be formed from layers common to both the FeFET and the logic FET. In that case, for instance, the ferroelectric material 120, the dielectric capping layer 122, and the electrode 124 would have the same composition as the gate dielectric 130, the dielectric capping layer 132, and the gate metal layer 134, respectively.

Specifically, logic FET 104 includes a gate dielectric 130 disposed on the substrate 106, an optional dielectric capping layer 132 disposed on the gate dielectric 130, a gate metal layer 134 disposed on the dielectric capping layer 132 (or directly on the gate dielectric 130 if the dielectric capping layer 132 is not used), an optional gate capping layer 136 disposed on the gate metal layer 134 and optional additional/second gate metal layer 138 disposed on the gate capping layer 136. According to an exemplary embodiment, as provided above, the gate dielectric 130, the dielectric capping layer 132, and the gate metal layer 134, are co-fabricated with the FeFET and thus have the same composition as the ferroelectric material 120, the dielectric capping layer 122, and the electrode 124, respectively. Thus, gate dielectric 130 can include a $HfO_2$-based material such as pure $HfO_2$, $Hf_{-0.5}Zr_{-0.5}O_2$, and/or $HfO_2$ doped with small quantities of N, C, Si, Al, La, Gd, Y, Sc, and/or Sr. As above, suitable materials for the dielectric capping layer 132 include, but are not limited to, $La_2O_3$ and/or aluminum $Al_2O_3$. Suitable metals for use in metal layer 134 include, but are not limited to, TiN and/or TaN.

The optional/additional gate capping layer 136 and optional second gate metal layer 138 can be used to tune the threshold voltage (Vt) of the logic FET. See, for example, U.S. Patent Application Publication Number 2009/0152636 by Chudzik et al., entitled "High-K/Metal Gate Stack Using Capping Layer Methods, IC and Related Transistors," the contents of which are incorporated by reference as if fully set forth herein. Suitable materials for gate capping layer 136 include, but are not limited to, $La_2O_3$ and/or aluminum oxide $Al_2O_3$. Being optional, when the gate capping layer 136 is not present, there may be no need for the second gate metal layer 138. However, the workfunction of a metal gate can be tuned by combining multiple layers of different workfunction-setting metals. Thus, according to an exemplary embodiment, the (first) gate metal layer 134 might contain TiN while the second gate metal layer 138 contains TaN, or vice versa.

Given the above overview of the present techniques, an exemplary methodology for forming (synaptic) FeFETs in the CMOS front-end is now described by way of reference to FIGS. 2-12. In order to illustrate the compatibility of the present techniques with front-end CMOS circuitry, the example given in this process flow will involve co-fabricating at least one FeFET 102 along with at least one logic FET 104 on the same substrate 106. While the formation of a single FeFET 102 on the substrate alongside a single logic FET 104 will be described, this is being done merely for ease and clarity of depiction and the same process can be employed in the same manner described to fabricate multiple FET devices of either type (i.e., FeFET or logic FET). It is noted that like structures with those in FIG. 1 are numbered alike in the following description of the fabrication process.

Figure 2:
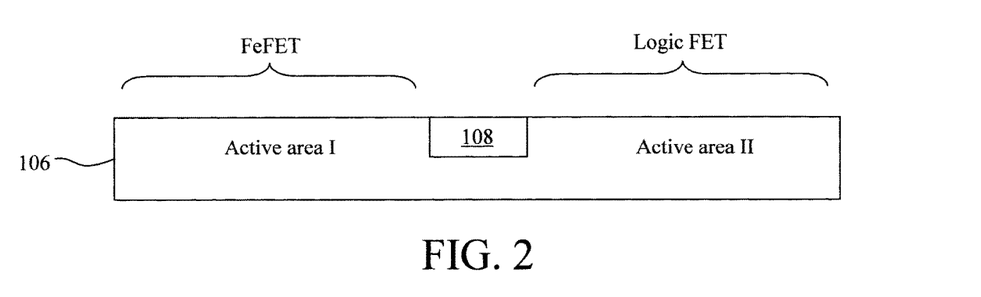
FIG. 2 is a diagram illustrating a starting structure for forming the FET device of FIG. 1 including a substrate and a shallow trench isolation (STI) region defining at least two active areas (e.g., Active area I and Active area II) in the substrate according to an embodiment of the present invention.

As shown in FIG. 2, the process begins with substrate 106. Suitable substrates 106 include, but are not limited to, a bulk semiconductor, e.g., silicon (Si), germanium (Ge), and/or silicon germanium (SiGe) wafer, and a semiconductor-on-insulator (SOI) wafer. An SOI wafer includes an SOI layer separated from a substrate by a buried insulator. When the insulator is an oxide, it is often referred to as a buried oxide or BOX. Substrate 106 is doped with an n-type or p-type dopant. Suitable n-type dopants include, but are not limited to, phosphorous (P) and/or arsenic (As). Suitable p-type dopants include, but are not limited to, boron (B).

STI region 108 is used to define at least two active areas (e.g., Active area I and Active area II) in the substrate 106. For illustrative purposes only, in the present example FeFET 102 will be formed in the Active area I and logic FET 104 will be formed in the Active area II.

Further, as highlighted above, one or more of the steps used to form FeFET 102 and logic FET 104 are preferably performed concurrently. In that case, the corresponding structures will have the same composition in both the (Fe and logic) FETs.

For instance, as shown in FIG. 3 a $HfO_2$-based material 302 is deposited onto the substrate 106 in both the FeFET (Active area I) and the logic FET (Active area II) regions. $HfO_2$-based material 302 can be deposited using a process such as atomic layer deposition (ALD) or sputtering. As is now apparent from the preceding description, the $HfO_2$-based material 302 will serve as the basis for forming the ferroelectric material 120 of the FeFET 102 and the gate dielectric 130 of the logic FET 104. As provided above, suitable $HfO_2$-based materials include, but are not limited to, pure $HfO_2$, $Hf_{-0.5}Zr_{-0.5}O_2$, and/or $HfO_2$ doped with small quantities of N, C, Si, Al, La, Gd, Y, Sc, and/or Sr.

The same applies to the dielectric capping layer 402 that is next optionally deposited onto the $HfO_2$-based material 302 in both the FeFET (Active area I) and the logic FET (Active area II) regions. See FIG. 4. This dielectric capping layer 402 will serve as the basis for forming the dielectric capping layer 122 of the FeFET and the dielectric capping layer 132 of the logic FET. As provided above, suitable materials for the dielectric capping layer 402 include, but are not limited to, $La_2O_3$ and/or $Al_2O_3$. The dielectric capping layer 402 can be deposited using a process such as ALD or chemical vapor deposition (CVD).

Figure 5:
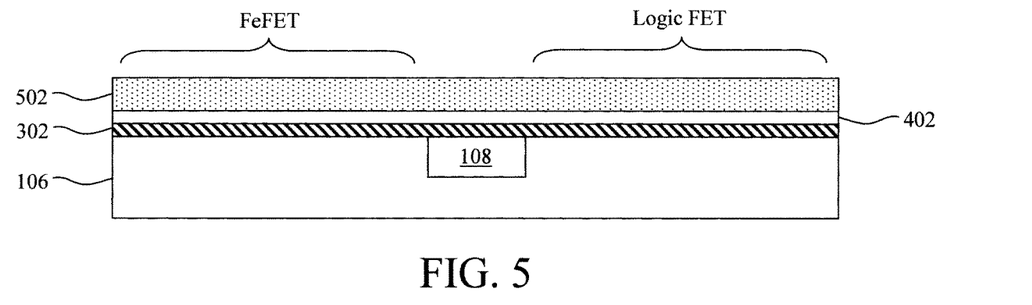
FIG. 5 is a diagram illustrating a metal layer having been deposited onto the (optional) dielectric capping layer in both the FeFET (Active area I) and the logic FET (Active area II) regions according to an embodiment of the present invention.

As shown in FIG. 5, a metal layer 502 is deposited onto the dielectric capping layer 402 (or directly onto the $HfO_2$-based material 302 if the dielectric capping layer 402 is not present) in both the FeFET (Active area I) and the logic FET (Active area II) regions. This metal layer 502 will serve as the basis for forming the electrode 124 of the FeFET 102 and the gate metal layer 134 of the logic FET 104. As provided above, suitable electrode/gate metals include, but are not limited to, TiN and/or TaN. The metal layer 502 can be deposited using a process such as evaporation or electrochemical plating.

Figure 6:
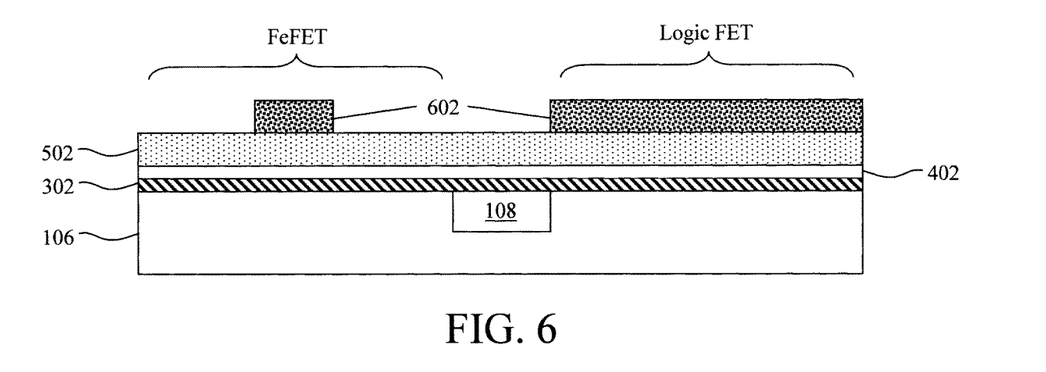
FIG. 6 is a diagram illustrating a patterned hardmask having been formed on the metal layer marking the footprint and location of the at least one FeFET in the Active area I according to an embodiment of the present invention.
Figure 7:
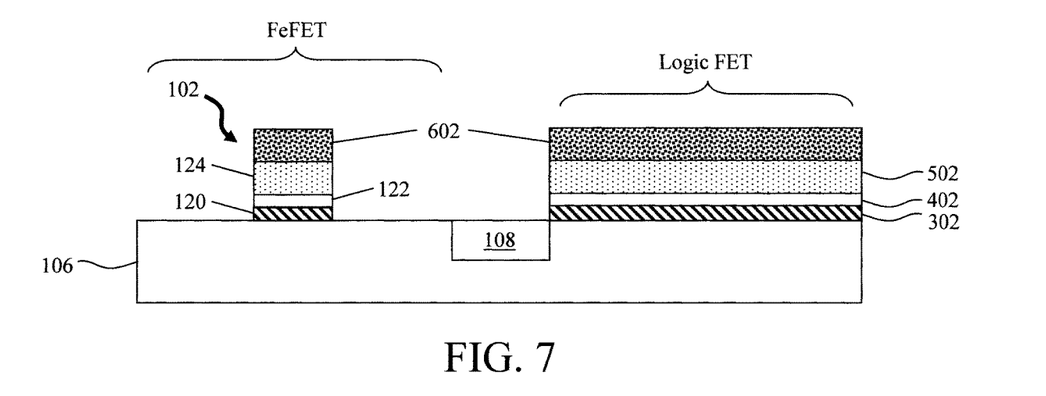
FIG. 7 is a diagram illustrating an etch with the hardmask having been used to pattern the stack of materials into the at least one individual FeFET in the Active area I having a ferroelectric material (formed from the $HfO_2$-based material) disposed on the substrate, an (optional) dielectric capping layer (formed from dielectric capping layer) disposed on the ferroelectric material, and an electrode (formed from metal layer) disposed on the dielectric capping layer according to an embodiment of the present invention.
Figure 8:
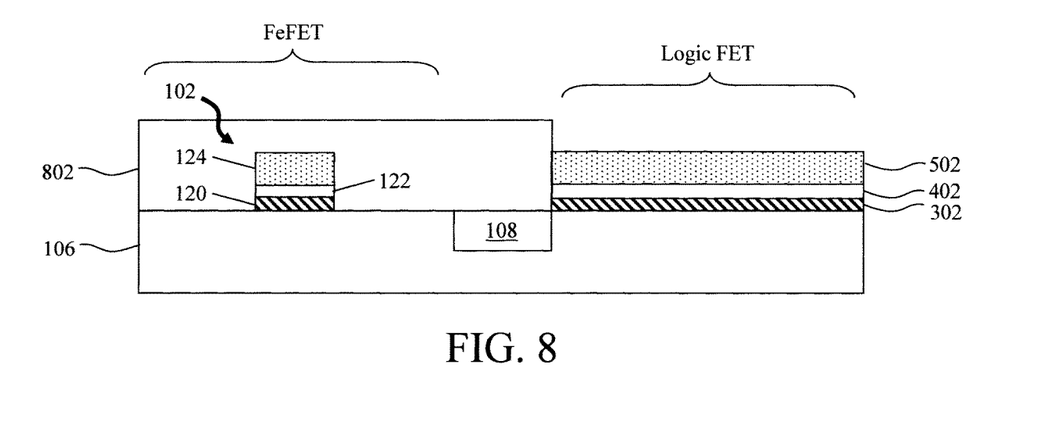
FIG. 8 is a diagram illustrating the hardmask having been removed and a block mask having been formed covering the (patterned) FeFET in the Active area I according to an embodiment of the present invention.

This completes the stack (i.e., $HfO_2$-based material 302/dielectric capping layer 402/metal layer 502) used to form the FeFET 102. According to an exemplary embodiment, the stack is next patterned into at least one individual FeFET 102. For instance, as shown in FIG. 6 a patterned hardmask 602 is formed on the metal layer 502 marking the footprint and location of the at least one FeFET 102 in the Active area I. Suitable hardmask materials include, but are not limited to, nitride hardmask materials such as silicon nitride (SiN).

An etch with the hardmask 602 is then used to pattern the stack into the at least one individual FeFET 102 in the Active area I having ferroelectric material 120 (formed from $HfO_2$-based material 302) disposed on the substrate 106, (optional) dielectric capping layer 122 (formed from dielectric capping layer 402) disposed on the ferroelectric material 120, and electrode 124 (formed from metal layer 502) disposed on the dielectric capping layer 122. See FIG. 7. An anisotropic etching process such as reactive ion etching (RIE) can be employed to etch the stack. Portions of the $HfO_2$-based material 302a/dielectric capping layer 402a/metal layer 502a remain in the stack in the Active area II. See FIG. 7.

As described above, the placement of the gate capping layer 136 and the second gate metal layer 138 in the logic FET is optional. Thus, according to an alternative embodiment where these optional layers are not employed, the logic FET stack is also considered complete at this stage in the process, and both FET devices (FeFET and logic FET) are patterned concurrently.

However, to enable further processing of the logic FET vis-à-vis the FeFET, following patterning of the FeFET 102 the hardmask 602 is removed and a block mask 802 is formed covering the (patterned) FeFET 102 in the Active area I. See FIG. 8. Suitable materials for block mask 802 include, but are not limited to, oxide masking materials such as $SiO_2$ and nitride masking materials such as SiN.

Figure 9:
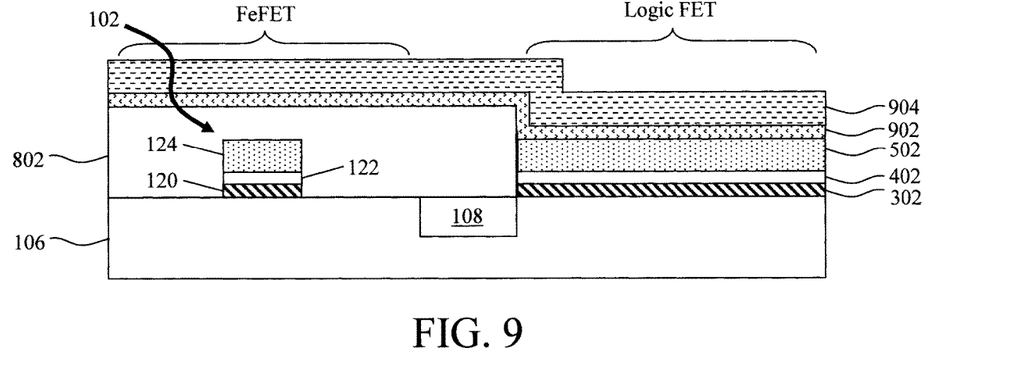
FIG. 9 is a diagram illustrating a capping layer having been deposited onto the metal layer, and a second metal layer having been deposited onto the capping layer according to an embodiment of the present invention.

As shown in FIG. 9, a second/additional dielectric capping layer 902 is deposited onto the metal layer 502, and a second/additional metal layer 904 (wherein metal layer 502 may, in this case, also be referred to herein as a first metal layer) is deposited onto the capping layer 902. Further, in order to distinguish dielectric capping layer 902 from dielectric capping layer 402, dielectric capping layer 402 may also be referred to herein as a first dielectric capping layer. As above, suitable materials for (second) capping layer 902 include, but are not limited to, $La_2O_3$ and/or aluminum $Al_2O_3$. Suitable metals for use in second metal layer 904 include, but are not limited to, TiN and/or TaN. The (second) capping layer 902 can be deposited using a process such as ALD or CVD, and the second metal layer 904 can be deposited using a process such as evaporation or electrochemical plating.

Figure 10:
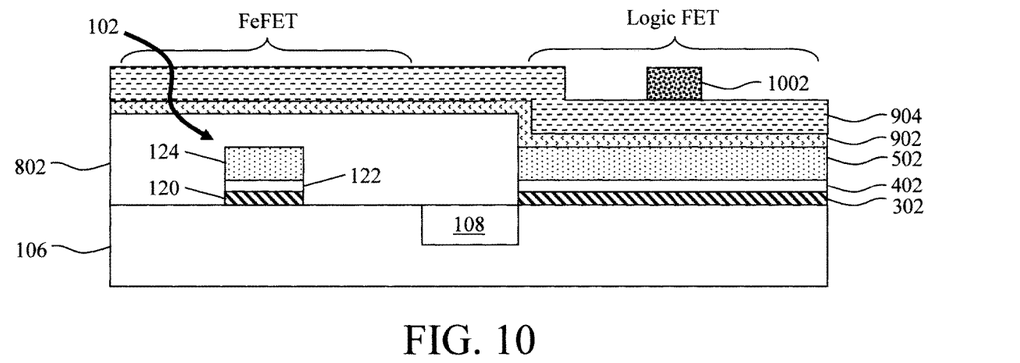
FIG. 10 is a diagram illustrating another patterned hardmask having been formed on the second metal layer marking the footprint and location of the at least one logic FET in the Active area II according to an embodiment of the present invention.
Figure 11:
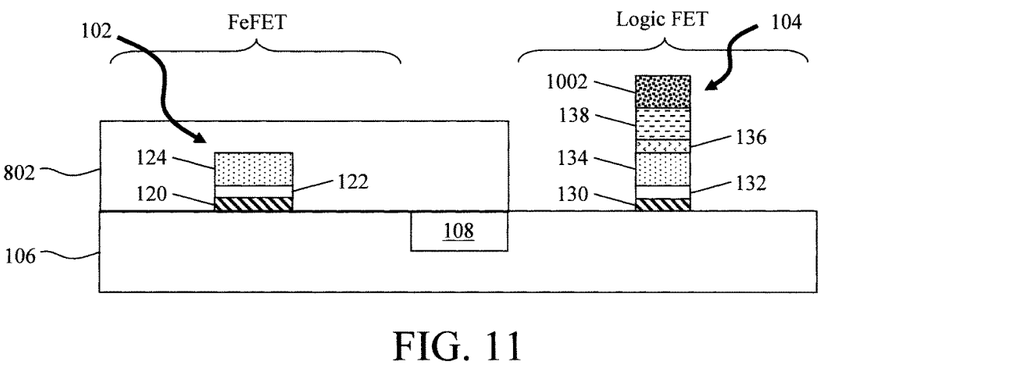
FIG. 11 is a diagram illustrating an etch with the hardmask having been used to pattern the stack into the at least one individual logic FET in the Active area II having a gate dielectric (formed from the $HfO_2$-based material) disposed on the substrate, an (optional) dielectric capping layer (formed from the dielectric capping layer) disposed on the gate dielectric, a gate metal layer (formed from the metal layer) disposed on the dielectric capping layer, an (optional) gate capping layer (formed from the capping layer) disposed on the gate metal layer and an (optional) second gate metal layer (formed from the second metal layer) disposed on the gate capping layer according to an embodiment of the present invention.

In the present example, this completes the stack (i.e., $HfO_2$-based material 302/dielectric capping layer 402/metal layer 502/(second) capping layer 902/second metal layer 904) used to form the logic FET 104. According to an exemplary embodiment, the stack is next patterned into at least one individual logic FET 104. Thus, as shown in FIG. 10 a patterned hardmask 1002 (e.g., SiN) is formed on the second metal layer 904 marking the footprint and location of the at least one logic FET 104 in the Active area II.

An etch with the hardmask 1002 is then used to pattern the stack into the at least one individual logic FET 104 in the Active area II having gate dielectric 130 (formed from $HfO_2$-based material 302) disposed on the substrate 106, (optional) dielectric capping layer 132 (formed from dielectric capping layer 402) disposed on the gate dielectric 130, gate metal layer 134 (formed from (first) metal layer 502) disposed on dielectric capping layer 132, (optional) gate capping layer 136 (formed from (second) capping layer 902) disposed on the gate metal layer 134 and (optional) second gate metal layer 138 (formed from second metal layer 904) disposed on the gate capping layer 136. See FIG. 11. An anisotropic etching process such as RIE can be employed to etch the stack.

Figure 12:
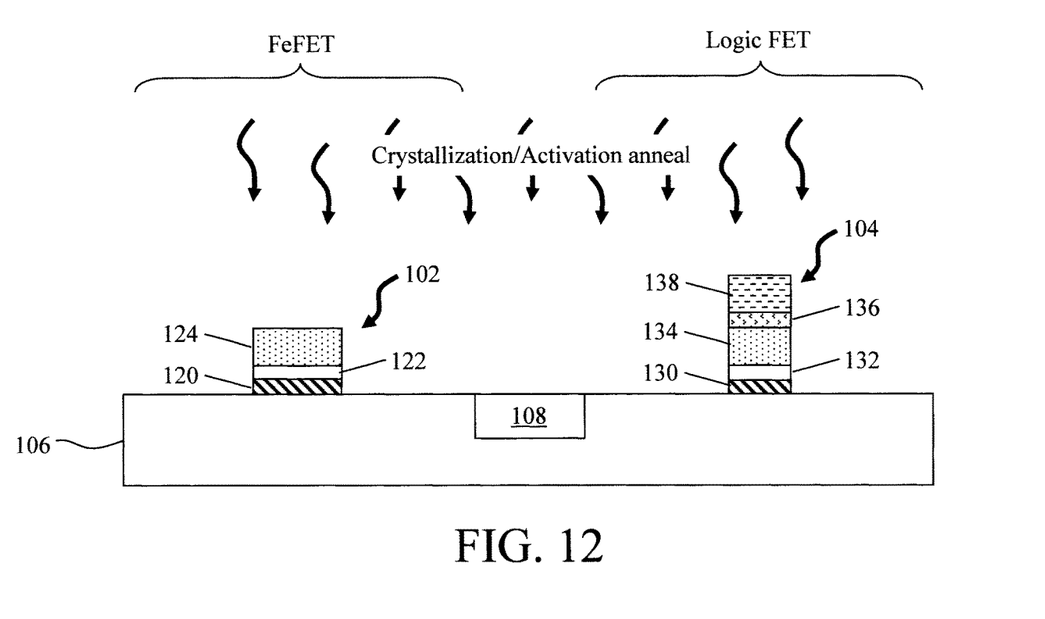
FIG. 12 is a diagram illustrating the remaining hardmask and the block mask having been removed and an anneal having been performed to crystallize the ferroelectric material in the FeFET, to set threshold voltage in the logic FET and to activate dopants according to an embodiment of the present invention.

Following completion of the logic FET 104 stack, any remaining hardmask 1002 is removed, as is the block mask 802. See FIG. 12. As shown in FIG. 12, an anneal is then performed. This anneal serves multiple purposes. First, regarding the FeFET 102 the anneal is used to crystallize the ferroelectric material 120 in the ferroelectric phase which is necessary for the FeFET 102 to function as an analog device. Second, when present, the anneal may diffuse elements from the capping layers (i.e., dielectric capping layer 132 and/or gate capping layer 136) into the gate dielectric 130, gate metal layer 134 and/or second gate metal layer 138 to tune the Vt of the logic FET. Third, the anneal activates dopants (such as the dopants within the substrate 106—see above). According to an exemplary embodiment, the anneal is performed at a temperature of from about 800° C. to about 1200° C., and ranges therebetween, e.g., from about 1000° C. to about 1200° C., and ranges therebetween. Advantageously, the $HfO_2$-based materials provided above for use as the ferroelectric material 120 in FeFET 102 will crystallize and remain stable in the ferroelectric phase at these temperatures. Optionally, in order to enhance device reliability, the gate dielectric 130 of the logic FET can be kept thin enough (less than about 20 angstroms (Å)) so that is does not crystallize and/or can be formed from a separate/different $HfO_2$-based material which crystallizes at a different temperature.

In the immediately preceding example, a common $HfO_2$-based layer is being used in both the FeFET and the logic FET. However, it may be preferable to be able to tune the $HfO_2$-based material separately for each type of FET (FeFET or logic FET). For instance, the FeFET might have a different $HfO_2$-based material from the logic FET and/or a thickness of the $HfO_2$-based material might be different in the FeFET than in the logic FET, etc. In that regard, an alternative exemplary methodology for forming (synaptic) FeFETs in the CMOS front-end is now described by way of reference to FIGS. 13-19.

As above, the example given in this process flow will involve co-fabricating at least one FeFET (i.e., FeFET 102a to differentiate it from FeFET 102 above) along with at least one logic FET (i.e., logic FET 104a to differentiate it from logic FET 104 above) on the same substrate. While the formation of a single FeFET 102a on the substrate alongside a single logic FET 104a will be described, this is being done merely for ease and clarity of depiction and the same process can be employed in the same manner described to fabricate multiple FET devices of either type (i.e., FeFET or logic FET). Further, in the depiction of the process flow a number of the above-described steps may be consolidated into a single figure.

As above, the process begins with substrate 1306. See FIG. 13. Suitable substrates 1306 include, but are not limited to, a bulk semiconductor, e.g., Si, Ge, and/or SiGe wafer, and a SOI wafer. Substrate 1306 is doped with an n-type or p-type dopant. Suitable n-type dopants include, but are not limited to, phosphorous (P) and/or arsenic (As). Suitable p-type dopants include, but are not limited to, boron (B).

Figure 13:
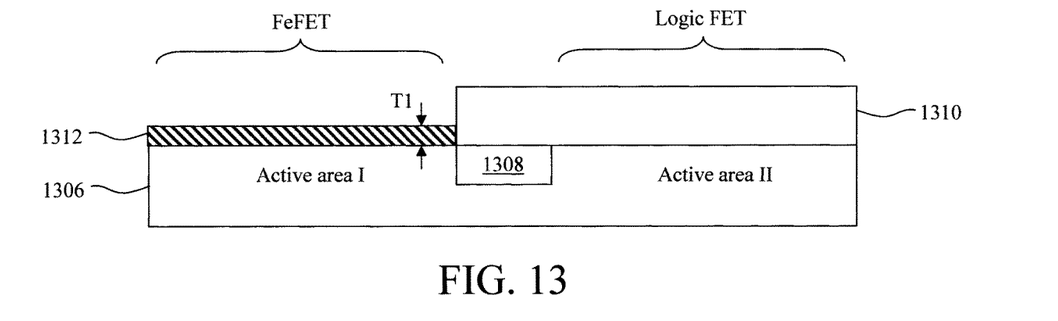
FIG. 13 is a diagram illustrating a starting structure for forming a FET device according to an alternative embodiment of the present techniques including a substrate and a STI region defining at least two active areas (e.g., Active area I and Active area II) in the substrate, a first block mask having been formed covering the logic FET (Active area II) and a (first) $HfO_2$-based material having been deposited onto the substrate in the FeFET (Active area I) according to an embodiment of the present invention.

STI region 1308 is used to define at least two active areas (e.g., Active area I and Active area II) in the substrate 1306. For illustrative purposes only, in the present example an FeFET 102a will be formed in the Active area I and a logic FET 104a will be formed in the Active area II.

Further, as above, one or more of the steps used to form FeFET 102a and logic FET 104a are preferably performed concurrently. In that case, the corresponding structures will have the same composition in both the (Fe and logic) FETs. However, in contrast to the example above, the $HfO_2$-based material will be deposited for the ferroelectric material of the FeFET 102a separate from the $HfO_2$-based material for the gate dielectric of the logic FET 104a.

For instance, as shown in FIG. 13, a block mask 1310 is first formed covering the Active area II (for the logic FET 104a), and a (first) $HfO_2$-based material 1312 is deposited onto the substrate 1306 in the FeFET (Active area I). $HfO_2$-based material 1312 can be deposited using a process such as ALD or sputtering. As provided above, suitable materials for block mask 1310 include, but are not limited to, oxide masking materials such as $SiO_2$ and nitride masking materials such as SiN. The $HfO_2$-based material 1312 will serve as the basis for forming the ferroelectric material (i.e., ferroelectric material 120a to differentiate it from the ferroelectric material 120 above). As provided above, suitable $HfO_2$-based materials include, but are not limited to, pure $HfO_2$, $Hf_{-0.5}Zr_{-0.5}O_2$, and/or $HfO_2$ doped with small quantities of N, C, Si, Al, La, Gd, Y, Sc, and/or Sr.

Separately depositing the $HfO_2$-based material in the FeFET (Active area I) and then subsequently in the logic FET (Active area II) permits the use of different $HfO_2$-based material and/or differently configured $HfO_2$-based materials such as $HfO_2$-based materials having different thicknesses. In this particular example, $HfO_2$-based material 1312 is deposited in the FeFET (Active area I) to a thickness T1.

Figure 14:
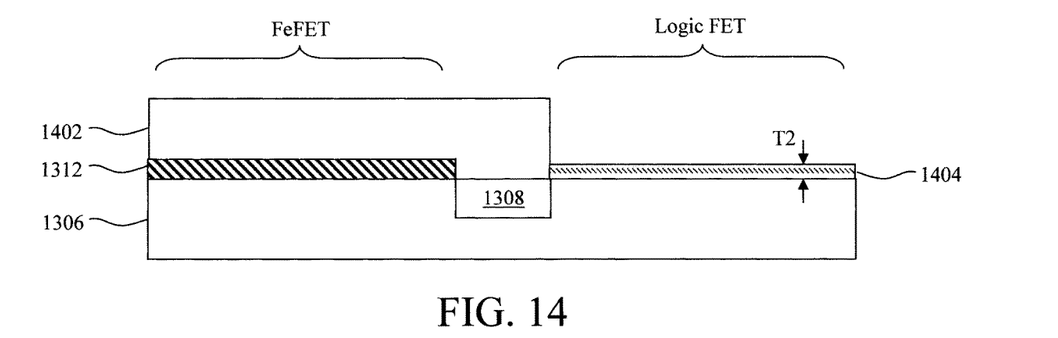
FIG. 14 is a diagram illustrating the first block mask having been removed, a second block mask having been formed covering the FeFET (Active area I) and a (second) $HfO_2$-based material having been deposited onto the substrate in the logic FET (Active area II) according to an embodiment of the present invention.

The block mask is then removed from the logic FET (Active area II) and the same process is then applied to selectively deposit a (second) $HfO_2$-based material 1404 in the logic FET (Active area II) via a block mask 1402 covering the FeFET (Active area I). The $HfO_2$-based material 1404 will serve as the basis for forming the gate dielectric (i.e., gate dielectric 130a to differentiate it from the ferroelectric material 130 above). In this particular example, $HfO_2$-based material 1404 is deposited in the logic FET (Active area II) to a thickness T2. According to an exemplary embodiment, T1>T2. As provided above, employing a thinner $HfO_2$-based material as the gate dielectric can advantageously prevent crystallization in the logic FET.

According to an exemplary embodiment, the $HfO_2$-based material 1404 is formed from a different $HfO_2$-based material from $HfO_2$-based material 1312, i.e., a different $HfO_2$-based material selected from: pure $HfO_2$, $Hf_{-0.5}Zr_{-0.5}O_2$, and/or $HfO_2$ doped with small quantities of N, C, Si, Al, La, Gd, Y, Sc, and/or Sr. As provided above, employing a different $HfO_2$-based material as the gate dielectric with a different crystallization temperature can advantageously prevent crystallization in the logic FET.

Figure 15:
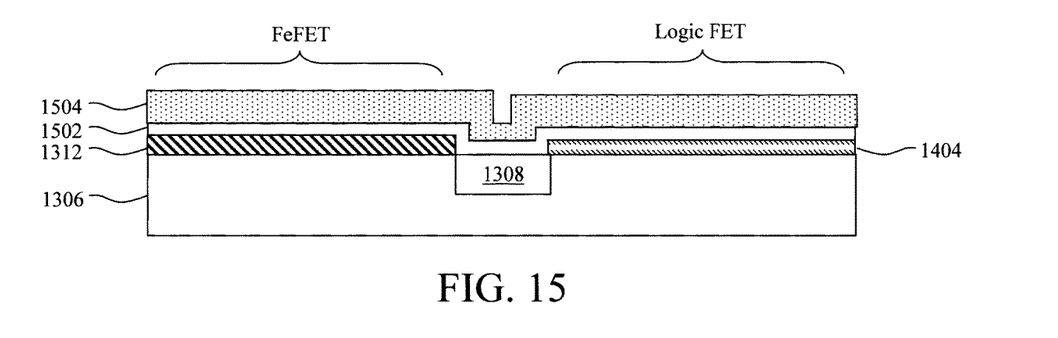
FIG. 15 is a diagram illustrating the second block mask having been removed, an optional dielectric capping layer having been deposited onto the first/second $HfO_2$-based materials in the FeFET (Active area I)/logic FET (Active area II) regions, and a metal layer having been deposited onto the (optional) dielectric capping layer in both the FeFET (Active area I) and the logic FET (Active area II) regions according to an embodiment of the present invention.

The block mask 1402 is then removed, and the process proceeds in generally the same manner as above. Namely, as shown in FIG. 15 a dielectric capping layer 1502 is next optionally deposited onto the HfO$_2$-based material 1312 in the FeFET (Active area I) and onto the HfO$_2$-based material 1404 in the logic FET (Active area II) regions. This dielectric capping layer 1502 will serve as the basis for forming the dielectric capping layer 122 of the FeFET 102a and the dielectric capping layer 132 of the logic FET 104a. As provided above, suitable materials for the dielectric capping layer include, but are not limited to, La$_2$O$_3$ and/or Al$_2$O$_3$. The dielectric capping layer 1502 can be deposited using a process such as ALD or CVD.

A metal layer 1504 is deposited onto the dielectric capping layer 1502 (or directly onto the first/second HfO$_2$-based material 1312/1404 if the dielectric capping layer 1502 is not present) in both the FeFET (Active area I) and the logic FET (Active area II) regions. This metal layer 1504 will serve as the basis for forming the electrode 124 of the FeFET 102a and the gate metal layer 134 of the logic FET 104a. As provided above, suitable electrode/gate metals include, but are not limited to, TiN and/or TaN. The metal layer 1504 can be deposited using a process such as evaporation or electrochemical plating.

Figure 16:
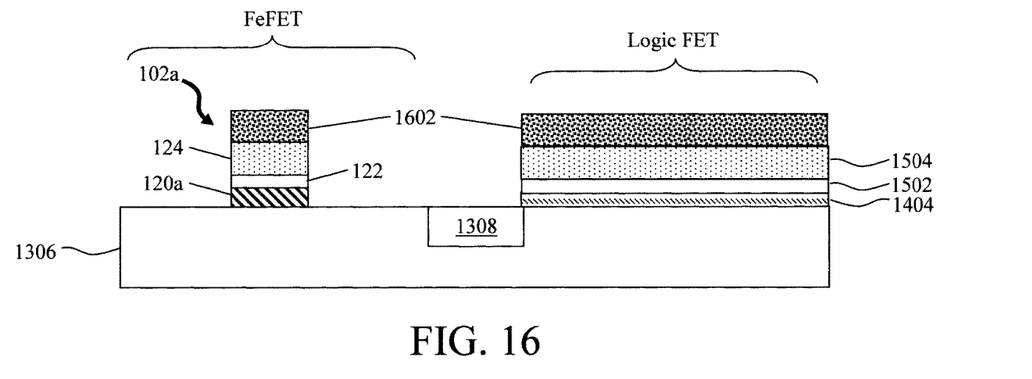
FIG. 16 is a diagram illustrating a patterned hardmask having been formed on the metal layer marking the footprint and location of the at least one FeFET in the Active area I, and an etch with the hardmask having been used to pattern the stack of materials into the at least one individual FeFET in the Active area I having a ferroelectric material (formed from the first $HfO_2$-based material) disposed on the substrate, an (optional) dielectric capping layer (formed from dielectric capping layer) disposed on the ferroelectric material, and an electrode (formed from metal layer) disposed on the dielectric capping layer according to an embodiment of the present invention.

This completes the stack (i.e., HfO$_2$-based material 1312/dielectric capping layer 1502/metal layer 1504) used to form the FeFET 102a. According to an exemplary embodiment, the stack is next patterned into at least one individual FeFET 102a. For instance, as shown in FIG. 16 a patterned hardmask 1602 (e.g., SiN) is formed on the metal layer 1504 marking the footprint and location of the at least one FeFET 102a in the Active area I.

An etch with the hardmask 1602 is then used to pattern the stack into the at least one individual FeFET 102a in the Active area I having ferroelectric material 120a (formed from HfO$_2$-based material 1312) disposed on the substrate 1306, (optional) dielectric capping layer 122 (formed from dielectric capping layer 1502) disposed on the ferroelectric material 120a, and electrode 124 (formed from metal layer 1504) disposed on the dielectric capping layer 122. See FIG. 16. An anisotropic etching process such as RIE can be employed to etch the stack. The HfO$_2$-based material 1404/dielectric capping layer 1502/metal layer 1504 remain in the stack in the Active area II. See FIG. 16.

As described above, the placement of the gate capping layer 136 and the second gate metal layer 138 in the logic FET is optional. Thus, according to an alternative embodiment where these optional layers are not employed, the logic FET stack is also considered complete at this stage in the process, and both FET devices (FeFET and logic FET) are patterned concurrently.

However, to enable further processing of the logic FET vis-à-vis the FeFET, following patterning of the FeFET 102a the hardmask 1602 is removed and a block mask 1702 is formed covering the (patterned) FeFET 102a in the Active area I. See FIG. 17. Suitable materials for block mask 1702 include, but are not limited to, oxide masking materials such as SiO$_2$ and nitride masking materials such as SiN.

Figure 17:
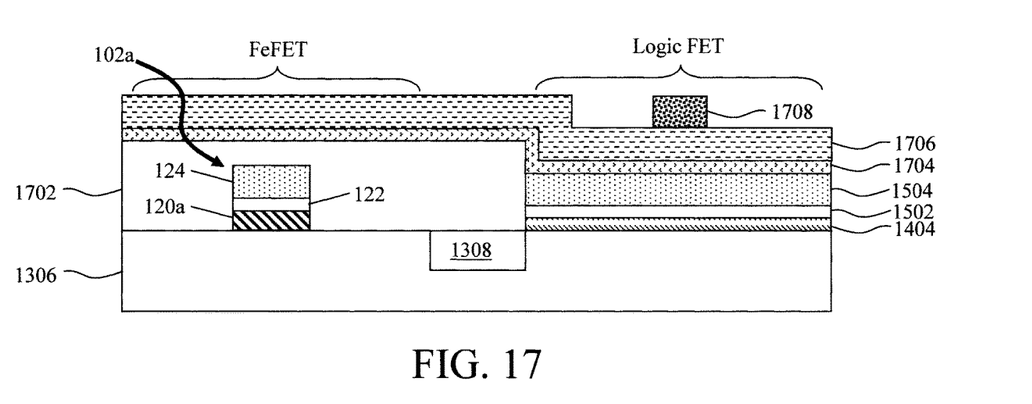
FIG. 17 is a diagram illustrating the hardmask having been removed, a block mask having been formed covering the (patterned) FeFET in the Active area I, a capping layer having been deposited onto the metal layer, and a second metal layer having been deposited onto the capping layer, and another patterned hardmask having been formed on the second metal layer marking the footprint and location of the at least one logic FET in the Active area II according to an embodiment of the present invention.
Figure 18:
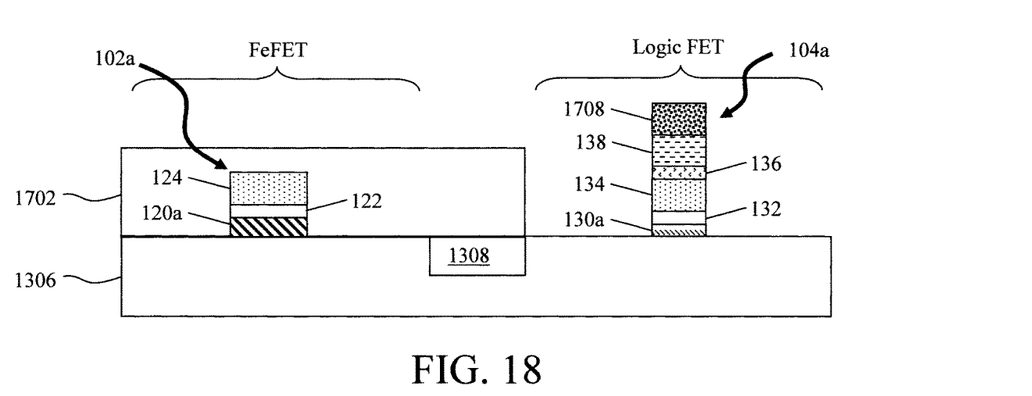
FIG. 18 is a diagram illustrating an etch with the hardmask having been used to pattern the stack into the at least one individual logic FET in the Active area II having a gate dielectric (formed from the second $HfO_2$-based material) disposed on the substrate, an (optional) dielectric capping layer (formed from the dielectric capping layer) disposed on the gate dielectric, a gate metal layer (formed from the metal layer) disposed on the dielectric capping layer, an (optional) gate capping layer (formed from the capping layer) disposed on the gate metal layer and an (optional) second gate metal layer (formed from the second metal layer) disposed on the gate capping layer according to an embodiment of the present invention.

A second/additional dielectric capping layer 1704 is deposited onto the metal layer 1504, and a second/additional metal layer 1706 (wherein metal layer 1504 may, in this case, also be referred to herein as a first metal layer) is deposited onto the capping layer 1704. Further, in order to distinguish dielectric capping layer 1704 from dielectric capping layer 1502, dielectric capping layer 1502 may also be referred to herein as a first dielectric capping layer. As above, suitable materials for (second) capping layer 1704 include, but are not limited to, La$_2$O$_3$ and/or aluminum Al$_2$O$_3$. Suitable metals for use in second metal layer 1706 include, but are not limited to, TiN and/or TaN. The (second) capping layer 1704 can be deposited using a process such as ALD or CVD, and the second metal layer 1706 can be deposited using a process such as evaporation or electrochemical plating.

In the present example, this completes the stack (i.e., HfO$_2$-based material 1404/dielectric capping layer 1502/metal layer 1504/(second) capping layer 1704/second metal layer 1706) used to form the logic FET 104a. According to an exemplary embodiment, the stack is next patterned into at least one individual logic FET 104a. To do so, a patterned hardmask 1708 (e.g., SiN) is formed on the second metal layer 1706 marking the footprint and location of the at least one logic FET 104a in the Active area II.

An etch with the hardmask 1708 is then used to pattern the stack into the at least one individual logic FET 104a in the Active area II having gate dielectric 130a (formed from HfO$_2$-based material 1404) disposed on the substrate 1306, (optional) dielectric capping layer 132 (formed from dielectric capping layer 1502) disposed on the gate dielectric 130a, gate metal layer 134 (formed from (first) metal layer 1504) disposed on dielectric capping layer 132, (optional) gate capping layer 136 (formed from (second) capping layer 1704) disposed on the gate metal layer 134 and (optional) second gate metal layer 138 (formed from second metal layer 1706) disposed on the gate capping layer 136. See FIG. 18. An anisotropic etching process such as RIE can be employed to etch the stack.

Figure 19:
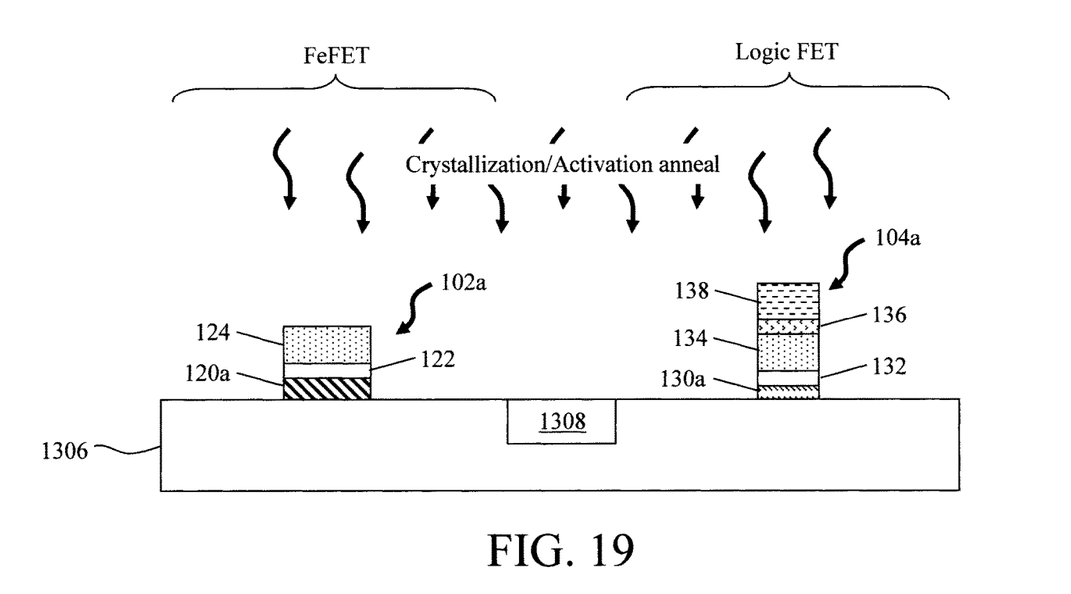
FIG. 19 is a diagram illustrating the remaining hardmask and the block mask having been removed and an anneal having been performed to crystallize the ferroelectric material in the FeFET, to set threshold voltage in the logic FET and to activate dopants according to an embodiment of the present invention.

Following completion of the logic FET 104a stack, any remaining hardmask 1708 is removed, as is the block mask 1702. See FIG. 19. As shown in FIG. 19, an anneal is then performed. This anneal serves multiple purposes. First, regarding the FeFET 102a the anneal is used to crystallize the ferroelectric material 120a in the ferroelectric phase which is necessary for the FeFET 102a to function as an analog device. Second, when present, the anneal may diffuse elements from the capping layers (i.e., dielectric capping layer 132 and/or gate capping layer 136) into the gate dielectric 130a, gate metal layer 134 and/or second gate metal layer 138 to tune the Vt of the logic FET. Third, the anneal activates dopants (such as the dopants within the substrate 1306—see above). According to an exemplary embodiment, the anneal is performed at a temperature of from about 800° C. to about 1200° C., and ranges therebetween, e.g., from about 1000° C. to about 1200° C., and ranges therebetween. Advantageously, the HfO$_2$-based materials provided above for use as the ferroelectric material 120a in FeFET 102a will crystallize and remain stable in the ferroelectric phase at these temperatures.

It is to be understood that the above-described FET device configurations and corresponding process flows are merely examples of how the present FeFET device designs can be implemented in the CMOS FEOL. Importantly, what the above embodiments illustrate is how the FeFET device structure and fabrication process can be easily and effectively integrated with the CMOS FEOL logic FET flow, including co-fabrication approaches where common HfO$_2$-based materials and other structures are used in both device types.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A field-effect transistor (FET) device, comprising:
    a substrate comprising a first active area separated from a second active area by a shallow trench isolation (STI) region;
    at least one ferroelectric FET (FeFET) on the substrate in the first active area having a ferroelectric material comprising a hafnium oxide ($HfO_2$)-based material; and
    at least one logic FET alongside the at least one FeFET on the substrate in the second active area, wherein the at least one logic FET has a gate dielectric comprising the $HfO_2$-based material, and wherein the at least one logic FET further comprises:
    the gate dielectric disposed on the substrate;
    a dielectric capping layer disposed on the gate dielectric;
    a gate metal layer disposed on the dielectric capping layer;
    a gate capping layer disposed on the gate metal layer; and
    an additional gate metal layer disposed on the gate capping layer.

2. The FET device of claim 1, wherein the $HfO_2$-based material is selected from the group consisting of: pure $HfO_2$, $Hf_{\sim 0.5}Zr_{\sim 0.5}O_2$, doped $HfO_2$, and combinations thereof.

3. The FET device of claim 2, wherein the doped $HfO_2$ comprises a dopant selected from the group consisting of: nitrogen (N), carbon (C), silicon (Si), aluminum (Al), lanthanum (La), gadolinium (Gd), yttrium (Y), scandium (Sc), strontium (Sr), and combinations thereof.

4. The FET device of claim 1, wherein the at least one FeFET further comprises:
    the ferroelectric material disposed on the substrate;
    a dielectric capping layer disposed on the ferroelectric material; and
    an electrode disposed on the dielectric capping layer.

5. The FET device of claim 4, wherein the dielectric capping layer comprises a material selected from the group consisting of: lanthanum oxide ($La_2O_3$), aluminum oxide ($Al_2O_3$), and combinations thereof.

6. The FET device of claim 4, wherein the electrode comprises a metal selected from the group consisting of: titanium nitride (TiN), tantalum nitride (TaN), and combinations thereof.

7. The FET device of claim 1, wherein the dielectric capping layer comprises a material selected from the group consisting of: $La_2O_3$, $Al_2O_3$ and combinations thereof.

8. The FET device of claim 1, wherein the gate capping layer comprises a material selected from the group consisting of: $La_2O_3$, $Al_2O_3$ and combinations thereof.

9. The FET device of claim 1, wherein the gate metal layer and the additional gate metal each comprises a metal selected from the group consisting of: TiN, TaN, and combinations thereof.

10. The FET device of claim 1, wherein the gate dielectric is selected from the group consisting of: pure $HfO_2$, $Hf_{\sim 0.5}Zr_{\sim 0.5}O_2$, doped $HfO_2$, and combinations thereof.

11. The FET device of claim 10, wherein the doped $HfO_2$ comprises a dopant selected from the group consisting of: N, C, Si, Al, La, Gd, Y, Sc, Sr, and combinations thereof.

12. A FET device, comprising:
    a substrate comprising a first active area separated from a second active area by a STI region;
    at least one FeFET on the substrate in the first active area having a ferroelectric material comprising a $HfO_2$-based material selected from the group consisting of: pure $HfO_2$, $Hf_{\sim 0.5}Zr_{\sim 0.5}O_2$, doped $HfO_2$, and combinations thereof; and
    at least one logic FET alongside the at least one FeFET on the substrate in the second active area, wherein the at least one logic FET has a gate dielectric comprising the $HfO_2$-based material, and wherein the at least one logic FET further comprises:
    the gate dielectric disposed on the substrate;
    a dielectric capping layer disposed on the gate dielectric;
    a gate metal layer disposed on the dielectric capping layer;
    a gate capping layer disposed on the gate metal layer; and
    an additional gate metal layer disposed on the gate capping layer.

13. The FET device of claim 12, wherein the doped $HfO_2$ comprises a dopant selected from the group consisting of: N, C, Si, Al, La, Gd, Y, Sc, Sr, and combinations thereof.

14. The FET device of claim 12, wherein the at least one FeFET further comprises:
    the ferroelectric material disposed on the substrate;
    a dielectric capping layer disposed on the ferroelectric material; and
    an electrode disposed on the dielectric capping layer.

15. The FET device of claim 14, wherein the dielectric capping layer comprises a material selected from the group consisting of: $La_2O_3$, $Al_2O_3$, and combinations thereof.

16. The FET device of claim 14, wherein the electrode comprises a metal selected from the group consisting of: TiN, TaN, and combinations thereof.

17. The FET device of claim 12, wherein the dielectric capping layer and the gate capping layer each comprises a material selected from the group consisting of: $La_2O_3$, $Al_2O_3$ and combinations thereof.

18. The FET device of claim 12, wherein the gate metal layer and the additional gate metal each comprises a metal selected from the group consisting of: TiN, TaN, and combinations thereof.

* * * * *